United States Patent
Mehnert et al.

(10) Patent No.: US 6,857,902 B2
(45) Date of Patent: Feb. 22, 2005

(54) PROXIMITY SWITCH AND A CABLE TERMINAL PART UNIT AND A PROCESS FOR ITS MANUFACTURE

(75) Inventors: Wolfgang Mehnert, Lindau (DE); Dirk Buche, Nonnenhorn (DE); Andreas Hornstein, Bodolz (DE); Franz Sauter, Tettnang (DE); Andrea Mollnau, Friedrichshafen (DE)

(73) Assignee: i f m electronics GmbH, Essen (DE)

( * ) Notice: Subject to any disclaimer, the term of this patent is extended or adjusted under 35 U.S.C. 154(b) by 0 days.

(21) Appl. No.: 10/078,540

(22) Filed: Feb. 21, 2002

(65) Prior Publication Data

US 2002/0149455 A1 Oct. 17, 2002

(30) Foreign Application Priority Data

Feb. 21, 2001 (DE) .......................................... 101 08 350

(51) Int. Cl.[7] ................................................ H01R 9/05
(52) U.S. Cl. ........................................ 439/579; 439/585
(58) Field of Search .......................... 439/95, 108–110, 439/607–610, 585–590, 579, 901, 910, 578; 335/205–207

(56) References Cited

U.S. PATENT DOCUMENTS

| | | | | |
|---|---|---|---|---|
| 3,990,765 A | * | 11/1976 | Hill | 439/610 |
| 4,614,398 A | * | 9/1986 | Wright et al. | 439/579 |
| 5,062,810 A | * | 11/1991 | Kroll | 439/589 |
| 5,490,801 A | * | 2/1996 | Fisher et al. | 439/585 |
| 5,573,411 A | * | 11/1996 | Bartosz et al. | 439/95 |
| 6,250,963 B1 | * | 6/2001 | Wright | 439/589 |

FOREIGN PATENT DOCUMENTS

| | | |
|---|---|---|
| DE | 42 25 267 C2 | 9/1993 |
| DE | 44 19 023 C2 | 12/1995 |
| DE | 195 28 678 C1 | 1/1997 |
| DE | 195 29 181 C2 | 2/1997 |

* cited by examiner

*Primary Examiner*—Lincoln Donovan
(74) *Attorney, Agent, or Firm*—Nixon Peabody LLP; David S. Safran (57) ABSTRACT

A electrical unit consisting of a proximity switch and a cable terminal part is described, where the proximity switch has an outside housing and an insulation part, positioned on one end face of the outside housing and having a terminal element with terminals which lead to the outside. The terminals of the terminal element include terminal sockets. The cable terminal part includes a cable and a connecting part, and the cable is mounted in the connecting part and the ends of the leads of the cable are electrically connected to the terminal sockets of the terminal element. The electrical unitcable terminal part also has a cap which surrounds at least the connecting part and is attached to the proximity switch.

16 Claims, 7 Drawing Sheets

PROXIMITY SWITCH AND A CABLE TERMINAL PART UNIT AND A PROCESS FOR ITS MANUFACTURE

BACKGROUND OF THE INVENTION

1. Field of the Invention

The invention relates to an electrical unit comprising a proximity switch and a cable terminal part and a process for its manufacture. The proximity switch having an outside housing and an insulation part, with the insulation part being on one end face of the outside housing and having a terminal element with terminals which lead to the outside. The terminals of the terminal element which lead to the outside being made as terminal sockets. The cable terminal part having a cable and a connecting part, the cable being mounted in the connecting part and the ends of the leads of the cable being connected electrically to the terminal sockets of the terminal element.

2. Description of the Related Art

The prior art discloses different possibilities for connecting detachable and fixed proximity switches to a cable. Plug-and-socket connections, that is detachable cable joints which are made using plug connectors which can be connected to the terminals of the proximity switch, are known for example in German patents 195 28 678 and 44 19 023 (the latter corresponding to U.S. Pat. No. 5,573,411). Another detachable cable joint, specifically a screw-type terminal, is shown by German patent 195 29 181. A proximity switch with a fixed or non-detachable cable terminal is shown, by way of example, in the German patent 42 25 267 which describes a housing termination comprising hot-melt cement through which the cables, which are connected directly to the electronics in the proximity switch, are routed out of the proximity switch.

Both the detachable joints of cables on proximity switches as well as the nondetachable cable terminals for proximity switches which are known from the prior art have a series of defects.

Detachable joints generally require a relatively large amount of space. Since recently the trend has been toward smaller and smaller proximity switches, only little space is available for one such detachable joint. In designs with plug connectors, it is also disadvantageous that they are much more expensive to manufacture than proximity switches to which the cables are directly connected.

In the last two decades, especially in the field of inductive proximity switches, it has been possible to further increase the operating distance at the same outside diameter of the coil which is used for the inductive proximity switch. This means that at a uniform operating distance the outside diameter of the proximity switch which is essentially dictated by the coil diameter has been reduced. This is advantageous to the user, but entails problems in forming connections, particularly with smaller devices, which are conventionally made in thread sizes M 6 to M 12. That is for cable terminal or plug terminal technology, the maximum plug diameter in cylindrical proximity switches generally will not be greater than the threaded or smooth sleeve diameter of the proximity switch in order to enable any installation in walls of different thickness.

In proximity switches with a non-detachable cable terminal, either the cable is permanently connected to the electronics and then the entire electrical unit after adjustment is inserted into the housing of the proximity switch and potted, or the electronics in the housing of the proximity switch is connected via flexible wires to the cable or plug, and only after final testing are the cables and plugs mechanically connected non-detachably and permanently to the housing, for example, by potting. These types of direct connection enable the shortest overall lengths, due to the long wires however a large amount of space is necessary.

Since the users of proximity switches, when selecting one type of proximity switch, ask for very many cable colors, cable materials and cable sizes which are different from one another, the diversity of types of proximity switches provided with a nondetachable cable is quite large; this leads to considerable warehousing costs for storage of all the conceivable types of proximity switches.

SUMMARY OF THE INVENTION

The aforementioned problem is solved by the electrical unit set forth in related U.S. patent application Ser. No. 09/770,228, now U.S. Pat. No. 6,614,335, the entire disclosure of which is hereby incorporated by reference, in that the proximity switch is completely finished, checked using the electrical terminals present in the form of terminal sockets, and can then be warehoused. Connection to a cable requested by the user takes place using the cable terminal part which includes the connecting part which fits the proximity switch and the cable requested by the user attached in the cable terminal part. The proximity switch and cable terminal part can then be joined quickly, easily and reliably.

The development of the subject matter of the present invention and the related U.S. Pat. No. 6,614,335, is based on the object of making available an electrical unit which meets the highest demands for tightness and strength.

This is achieved by the electrical unit essentially by a cable terminal part which has a cap which surrounds at least the cable terminal part and is attached, via the cap, to the proximity switch or to the outside housing of the proximity switch. Providing a cap can further increase the tightness of the electrical unit and its mechanical strength. In addition, through an appropriate choice of material for the cap, the electrical unit can be quickly and easily matched to different requirements. Thus, for example, due to the smooth form and corresponding selection of the material of the cap, an electrical unit can be achieved which meets the requirements of the food industry, and specifically ensures ease of cleaning.

The cap can be connected in different ways to the outside housing depending on the choice of material of the cap and the material of the outside housing of the proximity switch. Preferably, the cap is attached via a catch connection and/or stamping to the outside housing of the proximity switch. But in addition other techniques such as screwing, welding or cementing are also possible.

According to one preferred embodiment of the current invention, the cap is made such that the end of the cap facing away from the proximity switch is conically tapered. In this embodiment of the cap, it is possible for the cap to be used not only to connect the cable terminal part to the proximity switch, but also to at least partially to undertake sealing to the cable at the same time. To do this, the connecting part is radially compressed by the conically tapered end of the cap and thus pressed against the cable. Sealing via the cap and the connecting part is especially good when the length of the cap is dimensioned such that the connecting part is compressed when the cap is mounted on the proximity switch or the outside housing of the proximity switch. The connecting part thus has the function of a sealing element which is activated by attaching the cap to the outside housing of the proximity switch. Thus, the connecting part is compressed both axially and also radially in order that the connecting part seals both axially against the insulation part and also radially against the cable.

According to one alternative embodiment of the initially described electrical unit, a high level of tightness and high mechanical strength, and inparticular a high strain relief of the cable, is achieved in that a ring is assembled with the connecting part and the ring can be shifted out of a first form, in which the inside diameter of the ring is greater than or equal to the outside dimensions of the connecting part or greater than or equal to the outside dimensions of the cable, into a second form in which the inside diameter of the ring is less than the outside dimensions of the connecting part or less than the outside dimensions of the cable. When the inside diameter of the ring is reduced, the cable is squeezed and fixed in the connecting part such that the tension forces acting on the cable are kept away from the connecting joint between the ends of the cable wires and the terminal sockets of the terminal element.

It was stated above that the ring in the first form has an inside diameter which is greater than or equal to the outside dimensions of the connecting part or greater than or equal to the outside dimensions of the cable. If, according to one preferred embodiment of the invention, the ring is located in a groove which is made in the connecting part, the ring in its first form has an inside diameter which is greater than or equal to the outside dimensions of the connecting part. But, if the ring is located within the connecting part so that it is located between the cable and the connecting part, the ring in its first form has an inside diameter which is greater than or equal to the outside dimensions of the cable.

Generally, cables with a circular cross section are used so that the connecting part also has a circular cross section and thus the outside dimensions of the cable correspond to the outside diameter of the cable.

Strain relief of the cable, for different cable materials and cable diameters, can be achieved through a suitable choice both of the material and also the dimensions of the ring 13 diameter and width.

In one preferred embodiment, the ring is made of metal, especially high quality steel, and the reduction of the inside diameter is roughly 25%, the ring being concentric in the compressed form, i.e., with reduced inside diameter, and thus surrounding the connecting part without a gap.

Preferably, but not necessarily, the electrical unit has both the above described cap and also the above described ring, by which overall especially high tightness and mechanical strength are achieved.

One especially simple connection between the cable terminal part a proximity switch is achieved when there is an alignment aid for alignment of the ends of the wires of the cable. By using such an alignment aid, the wires are arranged such that they correspond in terms of position to the terminal sockets in the insulation part.

The alignment aid can be made as a separate part or can be located on the insulation part or the connecting part. The insertion of the ends of the wires of the cable is then especially simple when the alignment aid has holes with funnel-shaped or cup-shaped openings for receiving the ends of the wire.

In order to preclude pin confusion or polarity reversal when the proximity switch is joined to the cable terminal part, according to another preferred development of the invention, the electrical unit is constructed such that the insulation part and the cable terminal part each have codes which correspond to one another, and when joining the proximity switch and cable terminal part indicate the correct alignment of the cable terminal part to the insulation part. As a result, alignment of the two components to one another with the desired contact-making of the wires to the terminal elements is achieved. Alternatively or additionally, it is preferable that the insulation part and the cable terminal part each have a shape such that they can only be joined in the correct alignment of the cable terminal part to the insulation part. In this way it is no longer possible for the two components to twist before final attachment of the cable terminal part to the proximity switch.

Different techniques are possible for connecting or attaching the ends of the wires of the cable to the terminal sockets of the terminal element. For example, the terminal sockets can be slotted or can be made at least partially elastic so that the stripped ends of the wires of the cable, which can be tin-coated and/or bear at least partially conductive sleeves, can be inserted into the terminal sockets and as a result of the spring action of the terminal sockets they are easily and securely held in them and have good contact to them.

According to another preferred embodiment of the invention, the electrical unit is designed such that the terminal sockets can hold a connecting agent and are composed of a ferritic material. Preferably solder or conductive cement, especially conductive silver cement, is used as the connecting agent. The stripped ends of the cable wires, which are preferably tin-coated and/or are provided at least partially with conductive sleeves, then project into the terminal sockets and are soldered or cemented in the terminal sockets. The advantage of ferritic material for the terminal sockets is that eddy current effects propagate especially well in these materials, such that inductive soldering can be done easily.

To attach the insulation part in the outside housing, different techniques can be used. According to a preferred development of the invention, the insulation part is attached in the outside housing by stamping it. To attach the insulation part in the outside housing techniques, which are described for example in the German Utility Model 299 01 548, can be used. To ensure reliable sealing of the proximity switch, it is preferable that a seal, preferably an elastomer O-ring, is provided between the insulation part and the housing.

The process for producing an electrical unit comprising a proximity switch, which has an outside housing and an insulation part, and a cable terminal part, which has a connecting part and a cable, is characterized by the following steps:

providing the insulation part with a terminal element which runs through; its terminals which lead to the outside are made as terminal sockets,     connecting the outside housing and the insulation part,     attaching the cable in the connecting part,     attaching the cable terminal part to the proximity switch and     providing an electrically conductive connection of the ends of the wires of the cable to the terminal sockets of the terminal element, which is set forth in related U.S. Pat. No. 6,614,335, and further is characterized in that an induction coil, through which current flows, is located in the outside area of the electrical unit in the vicinity of the terminal sockets, but at an axial distance to the end of the outside housing.

By placing an induction coil in the outside area of the electrical unit, a simple and secure connection of the ends of the wires of the cable to the terminal sockets of the terminal element can be achieved by inductive soldering. If there are conductive materials located in the vicinity of the terminal sockets which are to be inductively heated, this leads to a limitation of the soldering capacity and to an undesirable heating of the conductive materials. This problem arises in the electrical unit mainly when the outside housing of the proximity switch is made of metal. To prevent unwanted heating of the outside sleeve of the proximity switch, the induction coil is located at an axial distance from the end of the outside housing. This axial distance of the induction coil to the outside housing of the proximity switch is preferably at least 5 mm. At this distance of the induction coil from the outside housing of the proximity switch, the soldering points, i.e., the terminal sockets, are heated adequately and it is necessary for the terminal sockets to project far out of the outside housing. In order to increase the desired heating of the soldering point, it is necessary that the magnetic field of the induction coil be kept away from the parts not involved in the inductive soldering, i.e. the outside housing of the proximity switch. In order to do this, according to one preferred embodiment of the process, the electrical unit is pushed through a conductive shielding sheet so that the shielding sheet is located between the end of the outside housing and the induction coil. The shielding sheet preferably has a distance of roughly 0.5 to 1.5 mm from the end of the outside housing and consists of aluminum which is easily handled and can be adapted very well to the respective circumstances.

According to another alternative embodiment of the process set forth in related U.S. Pat. No. 6,614,335, an especially high-degree of tightness and high mechanical strength of the electrical unit can be easily accomplished by reducing the diameter of the ring, which is pail of the connecting part, by a multi-segment press after the connecting part has been pushed over the cable. The advantages which accrue with the use of this ring have already been addressed above. By using a multi-segment press, the diameter of the ring can be easily reduced, while ensuring that the concentricity of the ring is preserved when the diameter of the ring is reduced. In addition, the degree of pressing, i.e., the reduction in the diameter of the ring, can be adjusted to any amount using the multi-segment press according to the dimensions of the cable or connecting part.

DETAILED DESCRIPTION OF THE INVENTION

Figure 1:
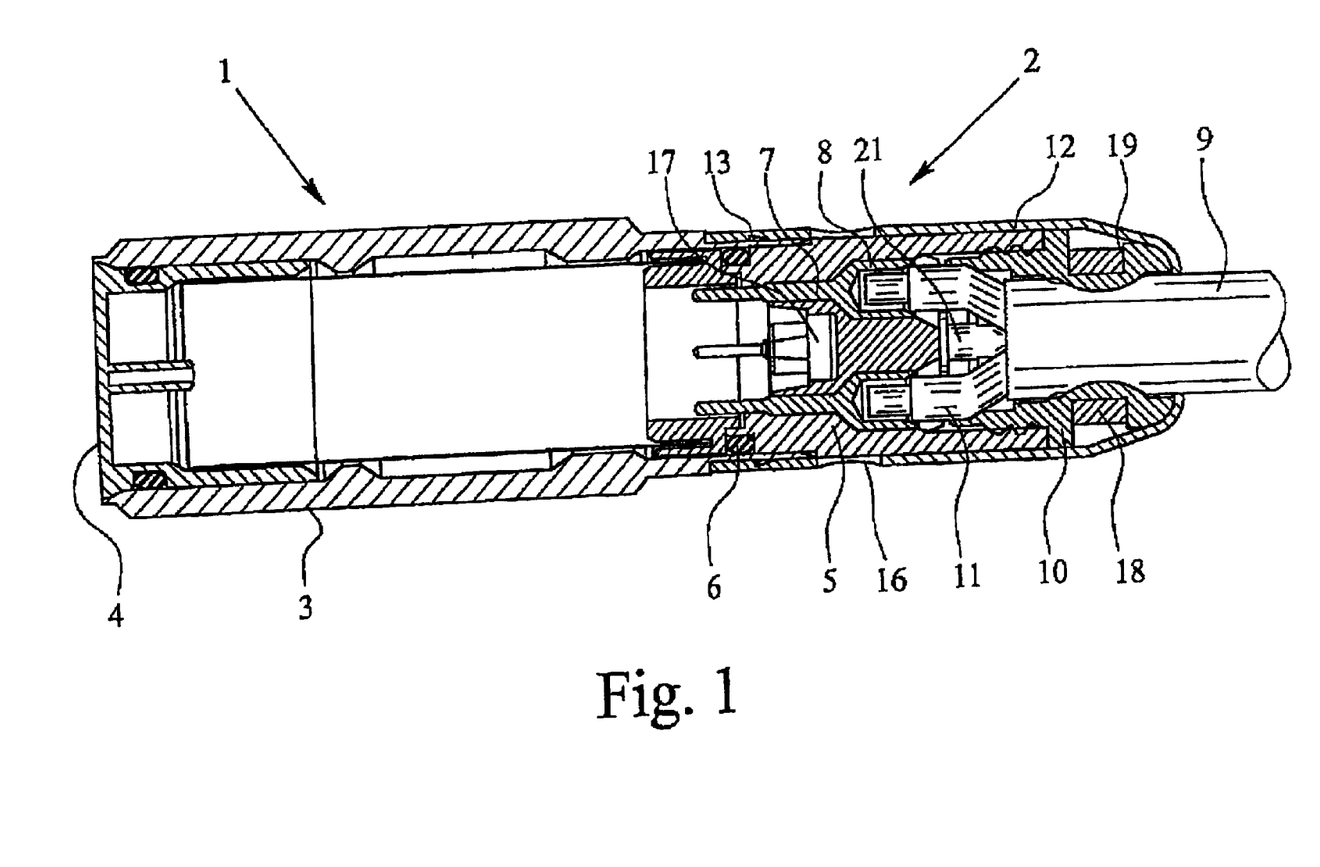
FIG. 1 shows a proximity switch connected with a cable terminal part according to the first preferred embodiment of the invention in a section.

FIG. 1 shows an electrical unit comprising a proximity switch 1 and a cable terminal part 2 in the connected state. The proximity switch 1 has a sleeve-shaped outside housing 3 with one end face closed by a pot-shaped cover 4 and there is an insulation part 5 on the other end face. If the proximity switch 1 is an inductive proximity switch, there is a coil which is not shown here in the cover 4. Alternatively, the one end face of the proximity switch 1 can also be closed by the outside housing 3 itself. The insulation part 5 is securely inserted sealed into the outside housing 3. To do this, there is a seal 6, preferably an elastomer O-ring, positioned between the insulation part 5 and the outside housing 3.

A terminal element 7 which is connected to electronics (not further shown) in the proximity switch 1 runs through the insulation part 5. The externally routed terminals of the terminal element 7 are made as cup-shaped terminal sockets 8. Joined to the proximity switch 1 is the cable terminal part 2 which has a cable 9 and a connecting part 10. The cable 9 is of the type and form which the user of the proximity switch 1 desires and has ordered according to the particular requirements for the proximity switch 1. The ends of the wires 11 of the cable 9 are stripped and tin-coated, inserted into the terminal sockets 8, and are connected electrically to them by soldering.

In the electrical unit of the invention, an especially high tightness and mechanical stability electrical unit is achieved by the cable terminal part 2 having a cap 12 through which the cable terminal part 2 is attached to the outside housing 3 of the proximity switch 1. The cap 12 surrounds the connecting part 10 with the end of the cable 9 inserted therein. The connection between the cap 12 and the outside housing 3 of the proximity switch 1 is made via a catch connection 13.

Depending on the application of the proximity switch, and after choosing the material for the cap 12, the attachment of the cap 12 to the outside housing 3 of the proximity switch 1 can also be established by screwing, welding, cementing or stamping. Preferably, the cap 12 is made of metal, especially high quality steel, and it is pressed onto the outside housing 3 which likewise is made of metal over the catch connection 13.

Figure 2A:
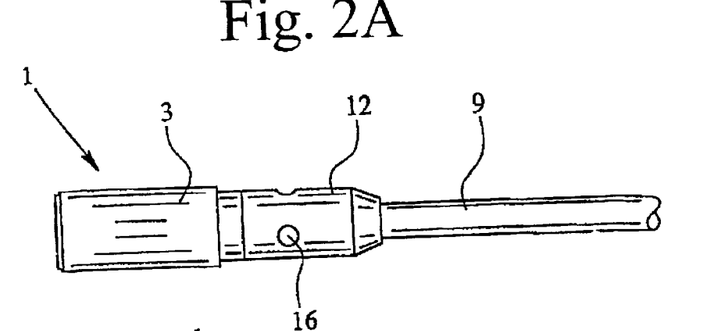
FIGS. 2A–2C illustrate the electrical unit as shown in FIG. 1 as an integral electrical unit and broken down into the proximity switch and the cable terminal part.
Figure 2B:
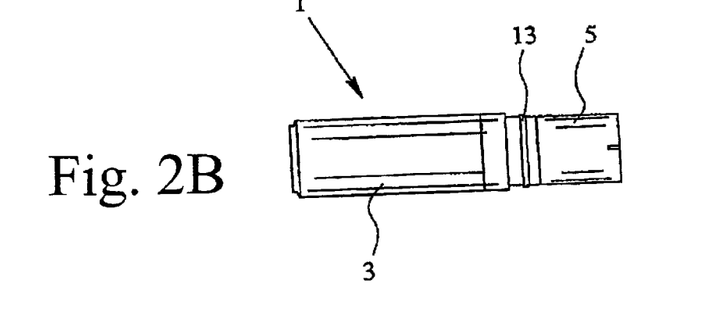
Figure 2C:
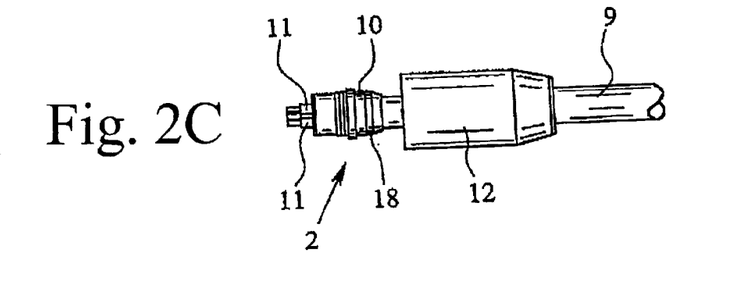

In the production of the electrical unit shown in FIG. 1 and FIG. 2A, according to one preferred embodiment of the invention, first the proximity switch 1 itself is completely finished, then checked, and then stored. FIG. 2B shows such a proximity switch 1 in the disassembled state. If the user orders a proximity switch 1 with a certain type of cable 9, a corresponding cable terminal part 2 comprising the desired cable 9, the connecting part 10 and the cap 12, is shown in FIG. 2C, is joined to the proximity switch 1. The cable terminal part 2 can either be pre-fabricated or fabricated only according to the user's order. If both the insulation part 5 and the connecting part 10 are made of plastic, a fixed connection of these two components to one another can be achieved by ultrasonic welding.

Figure 3A:
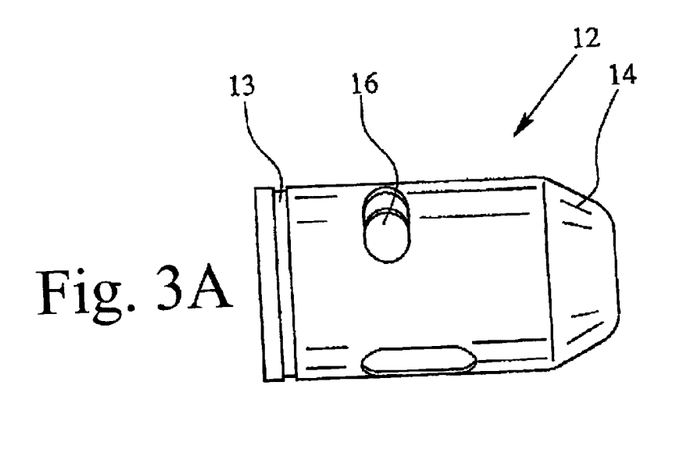
FIGS. 3A–3B show two different embodiments of the cap of a cable terminal part.
Figure 3B:
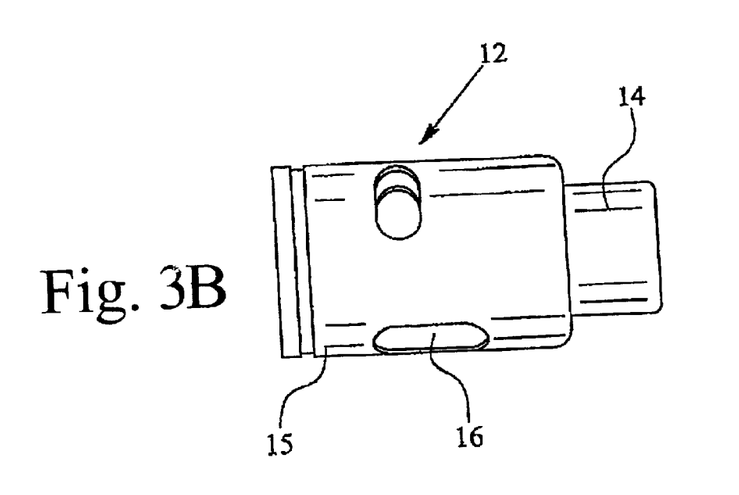

FIGS. 3A and 3B show two embodiments of a cap 12. In the preferred embodiment of the cap 12, as shown in FIG. 3A, the end 14 of the cap 12 which faces away from the proximity switch 1 tapers conically. This results in that the connecting element 10, which is preferably composed of an elastomer and has the function of the sealing element, is radially compressed by the conical part of the cap 12, by which a good seal is ensured between the cable 9 and the connecting part 10. Alternatively, the end 14 of the cap 12 facing away from the proximity switch 1 can also be made such that it has a constant, but smaller diameter than the end 15 of the cap 12 facing the proximity switch 1. One such embodiment of the cap 12 is shown in FIG. 3B. Here, the diameter reduction of the end 14 of the cap 12 facing away from the proximity switch 1 is accomplished only after final installation of the electrical unit.

The tightness of the electrical unit, which can be achieved by the cap 12 in conjunction with the connecting part 10, is preferably further increased by the length of the cap 12 being dimensioned such that the connecting part 10 is axially compressed when the cap 12 is attached to the outside housing 3 of the proximity switch 1. Axial compression of the connecting part 10 causes good sealing on the radial contact surfaces between the insulation part 5 and the connecting part 10 and between the connecting part 10 and the end of the cap 12, as well as causes radial expansion of the connecting part 10, by which good sealing on the axial contact surfaces is ensured between the insulation part 5 and the connecting part 10 and between the connecting part 10 and the cap 12.

In particular, FIGS. 3A and 3B moreover show that the cap 12 has several viewing holes 16 through which a display LED connected to the electronics of the proximity switch 1 is visible. Since the display LED 17 is surrounded at least in part by the insulation part 5, the insulation part 5 is then made of transparent plastic.

Figure 4A:
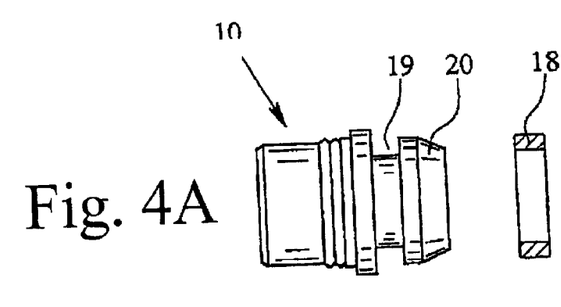
FIGS. 4A–4C show three different embodiments of the connecting part of the cable terminal part, each with one ring.

As is shown in FIG. 1, the connecting part 10 is not only pressed by the cap 12 onto the cable 9, but the connecting part 10 has a ring 18 which is located in a groove 19 situated in the connecting part 10 and presses the connecting part 10 radially against the cable 9. FIG. 4A illustrates the connecting part 10 and the ring 18 in the unassembled state in which the ring 18 has an inside diameter which is so great that the ring 18 can be pushed over the end 20 of the connecting part 10 into the groove 19. In the mounted state of the ring 18, which is shown in FIGS. 1 and 2C, the ring 18, on the connecting part 10, has an inside diameter which is smaller than the outside diameter of the connecting part 10 in the area of the groove 19.

After the connecting part 10, the cable 9 and the ring 18 have been combined, the diameter of the ring 18 is reduced, preferably in a multi-segment press. By using a multisegment press, it is ensured that the concentricity of the ring 18 is preserved, and the diameter reduction of the ring 18, which is preferably made of high quality steel, can be set very differently such that depending on the degree of pressing for different cable diameters the optimum strain relief for the respective cable 9 can be achieved. Preferably the reduction in the diameter of the ring 18 is roughly 25%.

Figure 4B:
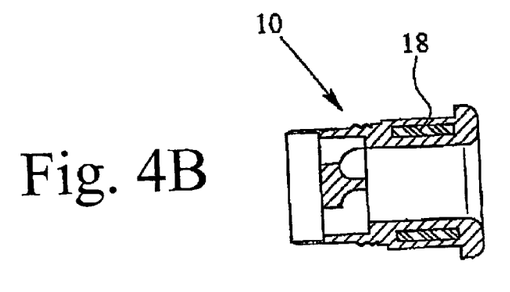
Figure 4C:
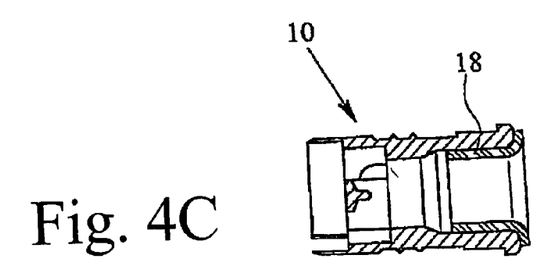

FIGS. 4B and 4C each show alternative possibilities for arrangement of the ring 18 relative to the connecting part 10. In the embodiment shown in FIG. 4B, the ring is connected securely to the connecting part 10 such that the ring 18 is extrusion coated with plastic so that the connecting part 10 and the ring 18 are made in one part. In the embodiment shown in FIG. 4C, the ring 18 is located within the connecting part 10, and thus, it is directly on the cable 9.

Figure 5A:
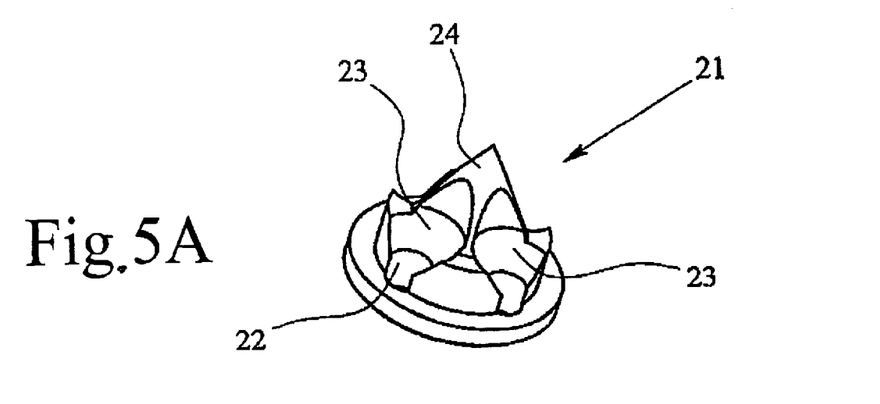
FIGS. 5A–5B show a preferred embodiment of part of the electrical unit, and in particular an alignment aid.
Figure 5B:
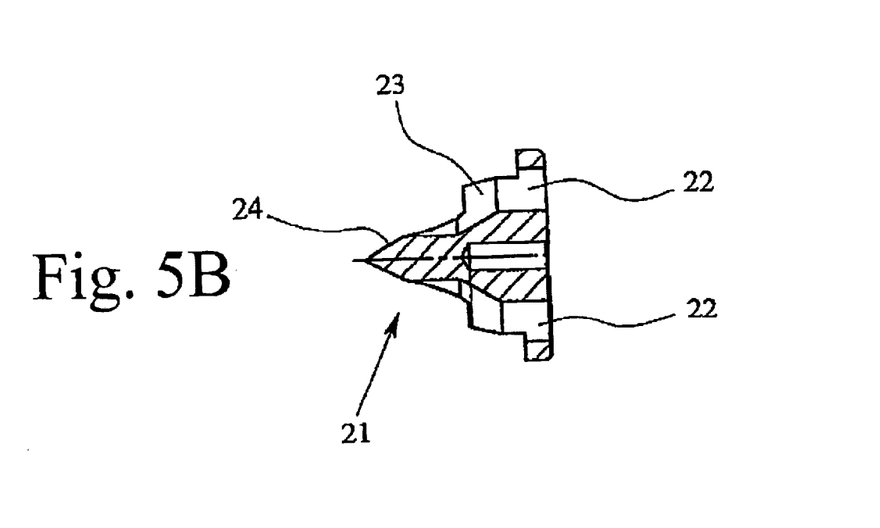

In order to facilitate joining of the cable terminal part 2 to a proximity switch 1, particularly for insertion of the ends of the wires 11 into the terminal sockets 8 of the terminal element 7, according to the preferred embodiment shown in FIG. 1, there is an alignment aid 21 for alignment of the ends of the wires 11 to the terminal sockets 8. One preferred embodiment of such an alignment aid 21 is shown in FIGS. 5A and 5B. The alignment aid 21 is a separate component and has holes 22 with funnel-shaped openings 23. One conical tip 24 provides for spreading of the individual wires 11 of the cable 9. Alternatively to the construction of the alignment aid 21 as a separate component, the alignment aid 21 can also be integrated in the insulation part 5 or the connecting part 10.

In order to prevent problems as a result of misorientation of the cable terminal part 2 relative to the proximity switch 1, both on the insulation part 5 and on the connecting part 10 there is provided coding which indicates the correct alignment of the two components relative to one another, i.e., that alignment in which the individual wires 11 of the cable 9 are inserted into the terminal sockets 8 which are intended for them. In addition, the insulation part 5 and the connecting part 10 each have a form which allows combining of these two components only in a single alignment. In this way, polarity reversal is reliably precluded when the proximity switch 1 is joined to the cable terminal part 2.

Figure 6A:
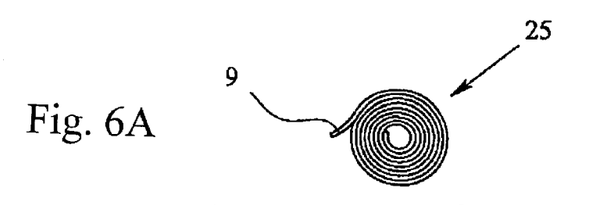
FIGS. 6A–6F show production of an electrical unit of the invention using six installation steps.
Figure 6B:
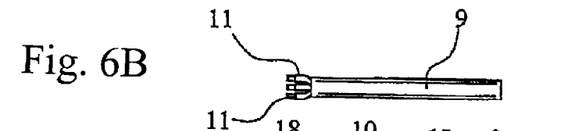
Figure 6C:
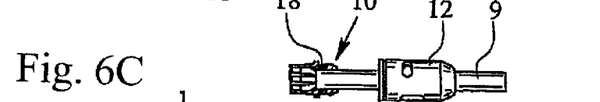

FIGS. 6A to 6F show different steps of the installation sequence of the electrical unit of the invention. If there is an order from a user for a proximity switch 1 with a certain type of cable 9, a corresponding length of the cable 9 is cut off the cable reel 25 and then on one end of the cable 9 first the cable insulation and then the insulation of the individual wires 11 are removed. After tin-plating the stripped ends of the wires 11, the prepared cable 9 which is shown in FIG. 6B results. A corresponding cap 12 is then pushed onto this cable 9, and the cable 9 is inserted into the connecting part 10. At this point, the diameter of the ring 18, which is located in the groove 19 of the connecting part 10, is reduced in a multi-segment press, so that the cable terminal part 2 shown in FIG. 6C results, in which the cable 9 is securely connected via the ring 18 to the connecting part 10.

Figures 6D, 6E, 6F:
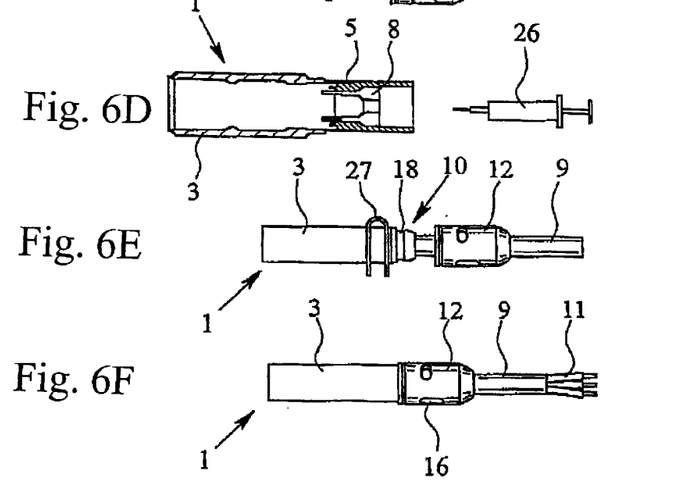

In the next step, then, the proximity switch 1, which has been completely finished and checked, has the cup-shaped terminal sockets 8 of the terminal elements 7 filled with a solder paste. This is done, preferably, with a suitably dimensioned dispenser 26. An electrically conductive connection between the stripped and tin-plated ends of the wires 11 of the cable 9 and the terminal sockets 8 is achieved in the proximity switch 1 with an induction coil 27 through which current flows and which is placed in the outside area of the electrical unit in the vicinity of the terminal sockets 8 at an axial distance from the end 28 of the outside housing 3. In this state, current flows through the induction coil 27 which causes heating of the terminal sockets 8, preferably composed of ferritic material, and thus, the solder and the tin-plated ends of the wires 11, so that the wires 11 are soldered to the terminal sockets 8.

Finally, the cap 12 is pressed onto the outside housing 3 of the proximity switch 1 such that the catch connection 13 locks, and the LED 17 is located in the proximity switch 1 so that the LED can be recognized from the outside through at least one viewing hole 16 of the cap 12.

Figure 7:
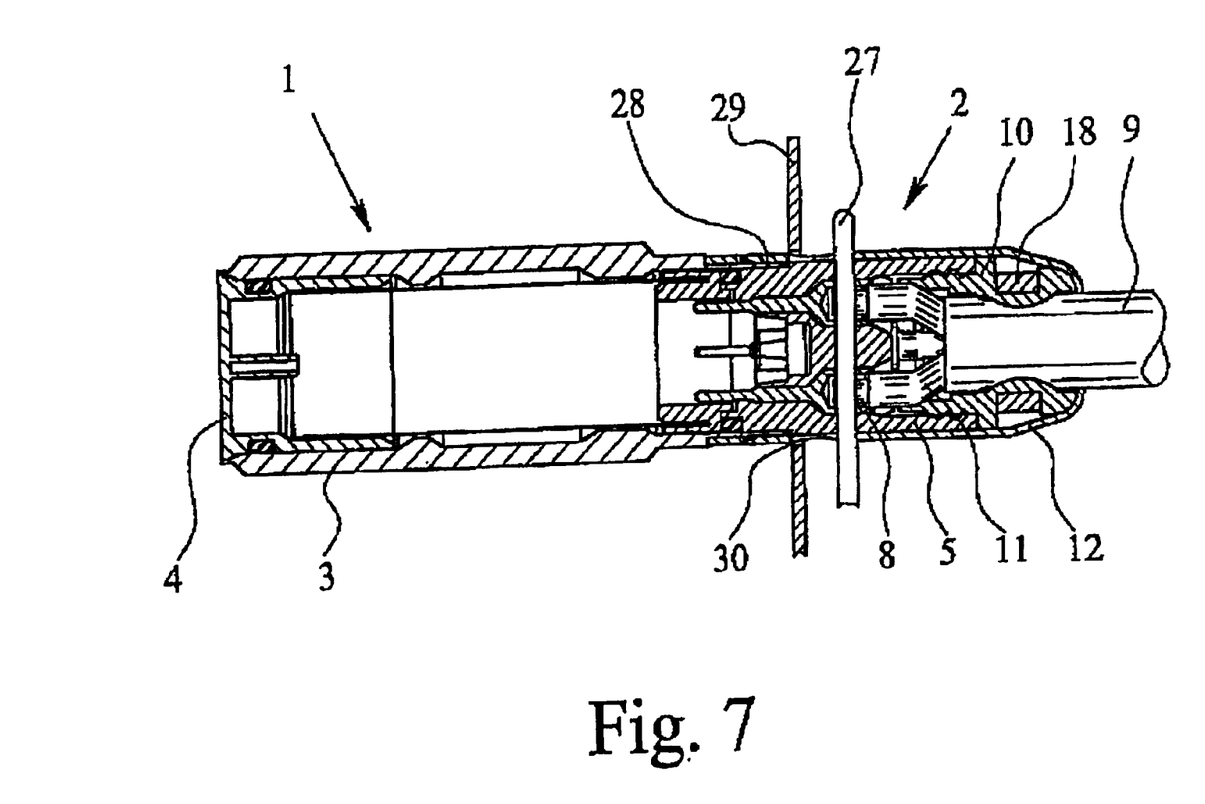
FIG. 7 shows an arrangement of an induction coil and a shielding sheet during inductive soldering of the ends of the wires of the cable with the terminal sockets of the terminal element.

FIG. 7 shows another preferred arrangement of the electrical unit of the invention for inductive soldering of the tin-plated ends of the wires 11 of the cable 9 with the terminal sockets 8 of the terminal element 7. In this embodiment, the electrical unit, which comprises the proximity switch 1 and the cable terminal part 2, before pressing on the cap 12, is pushed through a conductive shielding sheet 29 so that the end 28 of the metal-coated outside housing 3 is located on one side of the shielding sheet 29 and the terminal sockets 8 project through a hole 30 in the shielding sheet 29 on the other side of the shielding sheet 29. The induction coil 27, which is located in the vicinity of the terminal sockets 8, is thus separated by the shielding sheet 29 from one end 28 of the metallic outside housing 3. In this way, undesirable heating of the metallic outside housing 3 by the induction coil 27 is prevented. The shielding sheet 29 is preferably composed of aluminum, has a thickness of roughly 0.5 to 1.5 mm, preferably 0.75 mm, and is located at a distance of roughly 0.5 to 1.5 mm relative to the end 28 of the outside housing 3.

What is claimed is:

1. An electrical unit comprising a proximity switch and a cable terminal part, wherein the proximity switch includes an outside housing and an insulation part, the insulation part being located on one end face of the outside housing and containing a terminal element with terminal leads formed with terminal sockets, and wherein the cable terminal part includes a cable having wires and a connecting part, the cable being mounted in the connecting part and ends of leads of the wires being being positioned within the terminal sockets of the terminal element and being held therein by a solder connection, and further comprising a cap which surrounds at least the connecting part and is attached to an outside surface of the proximity switch.

2. The electrical unit as set forth in claim 1, wherein the cap is attached to the outside surface of the proximity switch by one of a catch connection and the cap having been pressed onto the outside surface of the proximity switch.

3. The electrical unit as set forth in claim 1, wherein an end of the cap facing away from the proximity switch has a conically tapered shape.

4. The electrical unit as set forth in claim 1, wherein an end of the cap facing away from the proximity switch has a smaller diameter than a portion of the cap facing the proximity switch.

5. The electrical unit as set forth in claim 1, wherein the cap has a size and shape which, when mounted on the outside surface of the proximity switch, radially compresses the connecting part.

6. The electrical unit as set forth in claim 1, further comprising an LED within the insulation part, wherein the insulation part is transparent and the cap has at least one viewing hole for viewing of the LED.

7. The electrical unit as set forth in claim 1, further comprising a ring positioned around the connecting part, said ring being positioned around the connecting part having been reduced to an inside diameter that is less than outside dimensions of the connecting part and the cable from an initial inside diameter that is at least equal to the outside dimensions of the connecting part and the cable.

8. The electrical unit as set forth in claim 7, wherein the ring is located in a groove formed in the connecting part.

9. The electrical unit as set forth in claim 7, wherein the ring is composed of metal, and the inside diameter has been reduced by up to 50%.

10. The electrical unit as set forth in claim 9, wherein the ring is composed of steel and inside diameter has been reduced by approximately 25%.

11. The electrical unit as set forth in claim 7, wherein the insulation part includes an alignment aid for aligning ends of the leads of the cable with the terminal sockets.

12. The electrical unit as set forth in claim 11, wherein the alignment aid includes holes for the leads, wherein each hole is one of a funnel-shaped or a cup-shaped opening.

13. The electrical unit as set forth in claim 7, wherein the insulation part and the cable terminal part each have corresponding alignment codes which enable correct alignment of the cable terminal part relative to the insulation part.

14. The electrical unit as set forth in claim 7, wherein the terminal sockets of the terminal element are composed of ferritic material and are shaped to hold a connecting agent.

15. The electrical unit as set forth in claim 7, wherein the insulation part is attached in the outside housing having been stamped thereon.

16. The electrical unit as set forth in claim 7, wherein the insulation part is secured in the outside housing in a sealed manner by a weld.

* * * * *